(12) United States Patent
Ohno et al.

(10) Patent No.: US 6,496,428 B2
(45) Date of Patent: Dec. 17, 2002

(54) SEMICONDUCTOR MEMORY

(75) Inventors: Chikai Ohno, Komae (JP); Hirokazu Yamazaki, Kawasaki (JP); Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/964,642

(22) Filed: Sep. 28, 2001

(65) Prior Publication Data
US 2002/0097618 A1 Jul. 25, 2002

(30) Foreign Application Priority Data

Jan. 19, 2001 (JP) .................................. 2001-012041
Jan. 19, 2001 (JP) .................................. 2001-012042

(51) Int. Cl.[7] ................................................ G11C 7/00
(52) U.S. Cl. .................. 365/200; 365/230.06; 365/145
(58) Field of Search ........................... 365/200, 145, 365/117, 65, 63, 189.01, 230.06

(56) References Cited

U.S. PATENT DOCUMENTS

| | | | | |
|---|---|---|---|---|
| 5,561,627 A | * | 10/1996 | Matsubara et al. | .... 365/185.04 |
| 5,914,907 A | * | 6/1999 | Kobayashi et al. | ......... 365/200 |
| 6,141,267 A | * | 10/2000 | Kirihata et al. | ........ 365/185.09 |
| 6,243,306 B1 | * | 6/2001 | Kirhata | ........................ 365/200 |
| 6,246,616 B1 | * | 6/2001 | Nagai et al. | ................. 365/145 |

FOREIGN PATENT DOCUMENTS

| | | |
|---|---|---|
| JP | 7-296595 | 11/1995 |
| JP | 8-83497 | 3/1996 |

* cited by examiner

*Primary Examiner*—Hoai Ho
*Assistant Examiner*—Thong Le
(74) *Attorney, Agent, or Firm*—Arent Fox Kintner Plotkin & Kahn, PLLC

(57) ABSTRACT

A redundancy information region having memory cells for retaining relief information indicating the locations of defective memory cells is arranged closer to at least one of a word driver or a plate driver than a memory cell region and a redundancy memory cell region. Since the memory cells of the redundancy information region start operation earlier, a relief/no-relief judgment can be made earlier, allowing reduction in access time. Besides, in memory cell operations, the defective memory cells are deselected in accordance with address information held in a redundancy address region. Redundancy memory cells for relieving the defective memory cells are selected in accordance with the relief information held in a redundancy flag region. Since the redundancy memory cells are selected without using the address information, it is possible to reduce the time that elapses before the redundancy memory cells are selected after the selection of word lines.

26 Claims, 10 Drawing Sheets

SEMICONDUCTOR MEMORY

BACKGROUND OF THE INVENTION

1. Field of the Invention

The present invention relates to a semiconductor memory having a redundancy circuit for relieving defects in memory cell regions. In particular, the present invention relates to a nonvolatile semiconductor memory having a redundancy circuit.

2. Description of the Related Art

In general, semiconductor memories are broadly classified into volatile semiconductor memories such as a DRAM (Dynamic Random Access Memory) which require power to hold data, and nonvolatile semiconductor memories such as a flash memory/EEPROM (Electrical Erasable Programmable Read Only Memory) which require no power to hold data. The performance of a semiconductor memory is often expressed in memory capacity, access speed, and power consumption.

DRAMs are mainly used for computer's main storage as large-capacity high-speed semiconductor memories. Because of being volatile, however, DRAMs require refresh operations to hold data, and thus are high in power consumption.

Flash memories/EEPROMs are mainly used for file systems, memory cards, portable equipment, and the like as large-capacity, low-power-consumption nonvolatile semiconductor memories. Flash memories/EEPROMs, however, require extremely longer time for data write.

Meanwhile, ferroelectric memories having memory cells composed of ferroelectric capacitors have been recently developed as semiconductor memories that combine the advantages of DRAMs and flash memories/EEPROMs. Ferroelectric memories can hold data even without power supply, by utilizing residual polarization that remains even after the voltages applied to their ferroelectric capacitors are removed.

Ferroelectric memories are increasing in memory capacity year after year, and their substitution for flash memories is under consideration. The rise in memory capacity tends to increase chip size. On this account, defect-relieving technologies (redundancy circuit technologies) for ferroelectric memories have been studied recently. Among known redundancy circuit technologies for ferroelectric memories is one disclosed in Japanese Unexamined Patent Application Publication No. 2000-215687, for example.

The ferroelectric memory disclosed in this publication contains ordinary memory cells, redundancy memory cells, and memory cells for redundancy files for retaining the column addresses of memory cells to be relieved as replacement information. These memory cells, redundancy memory cells, and memory cells for redundancy files are connected to common word lines. That is, in read operations and write operations, the memory cells, redundancy memory cells, and memory cells for redundancy files are simultaneously selected in accordance with the activation of the word lines. Each single redundancy memory cell is formed for, e.g., eight ordinary memory cells.

The ferroelectric memory has a logic circuit for decoding replacement information (defect addresses) read from the memory cells for redundancy files to generate decoding signals corresponding to each column address, and a logic circuit for generating the OR logic of these decoding signals. Column switches for the memory cells are deselected in response to any of the decoding signals. Column switches for the redundancy memory cells are selected in response to the OR logic of the decoding signals. That is, in response to the replacement information, access to defective memory cells is disabled and access to redundancy memory cells is enabled to relieve the defective memory cells.

FIG. 1 shows an overview of a ferroelectric memory having a redundancy circuit of this type.

In the diagram, the ferroelectric memory has a plurality of memory blocks MB. The memory blocks MB each have a word driver 10, a plate driver 12, a column control circuit 14, a memory cell region MCR, a redundancy memory cell region RCR, and a redundancy information region DCR.

The word driver 10 supplies a voltage to a predetermined word line WL according to a row address. The plate driver 12 supplies a voltage to a predetermined plate line PL according to the row address. The column control circuit 14 outputs column selecting signals CL and a redundancy column select signal RL to the memory cell region MCR and the redundancy memory cell region RCR, respectively, in accordance with a column address as well as relief information (relief address information and the like) output from the redundancy information region DCR. The activation of the column selecting signals CL turns on the column switches (not shown) in the memory cell region MCR. The activation of the redundancy column selecting signal RCL turns on the redundancy column switches (not shown) in the redundancy memory cell region RCR.

The memory cell region MCR is composed of memory cells MC to be used in normal operations. The redundancy memory cell region RCR is composed of memory cells MC for relieving defective memory cells. The redundancy information region DCR is composed of memory cells MC for indicating the locations of the defective memory cells. The memory cells MC in the memory cell region MCR, the redundancy memory cell region RCR, and the redundancy information region DCR are connected to common word lines WL and plate lines PL In read operations and write operations, memory cells in the memory cell region MCR, the redundancy memory cell region RCR, and the redundancy information region DCR are simultaneously selected in accordance with the activation of a word line WL and a plate line PL. In other words, memory cells MC that are activated between a word line WL and a plate line PL become accessible.

For example, if a word line WL and a plate line PL are activated to read relief information showing relief from a memory cell MC in the redundancy information region DCR, the column select signals CL are inactivated and the redundancy select signal RCL is activated. The inactivation of the column selecting signals CL turns off the column switches to disable the access to the defective memory cells MC in the memory cell region MCR (marked with crosses in the diagram). The activation of the redundancy column selecting signal CL turns on the redundancy column switches to enable the access to the memory cells MC in the redundancy memory cell region RCR (marked with circles in the diagram). That is, the defective memory cells MC are replaced with the normal memory cells MC to relieve the memory cells MC.

In the ferroelectric memory cell disclosed in the above-mentioned publication, the memory cells, redundancy memory cells, and memory cells for redundancy files are selected at the same time. Therefore, it is of importance to the high speed execution of read/write operations how to operate the column switches quickly in response to replacement information (column address). In the ferroelectric memory described above, however, the column switches for the redundancy memory cells are selected in accordance with the OR logic of the decoding signals which select the column switches for the ordinary memory cells. Accordingly, there has been a problem that the column switches for the redundancy memory cells delay in operation, with slower access time particularly during redundancy operations. The access time of a semiconductor memory is determined by the access time of the slowest memory cells. As a result, the access time of the redundancy memory cells makes the actual access time of the chip. Besides, there has been a problem that a rise in the circuit scale of the redundancy circuit can increase the chip size.

In each memory block MB of the ferroelectric memory shown in FIG. 1, the memory cell region MCR, the redundancy memory cell region RCR, and the redundancy information region DCR are successively arranged next to the word driver 10 and the plate driver 12. That is, the redundancy information region DCR is placed far from the word driver 10 and the plate driver 12.

Word lines WL and plate lines PL typically have parasitic resistance and parasitic capacitance. Thus, the farther from the word driver 10 and the plate driver 12 the memory cells MC are, the longer it takes until signals (voltages) are transmitted thereto. The memory cells MC of the redundancy information region DCR, farthest from the word driver 10 and the plate driver 12, are selected later than the other memory cells MC.

Due to the late selection of the memory cells MC in the redundancy information region DCR, the relief information is output from the redundancy information region DCR with a delay. Consequently, there has been a problem that the memory cells MC in the memory cell region MCR and the redundancy memory cell region RCR cannot be read/written quickly even though these memory cells MC are already selected. That is, there has been a problem of yet slower access time.

Since the memory cells MC in the memory cell region MCR, the redundancy memory cell region RCR, and the redundancy information region DCR are simultaneously selected by the word lines WL and plate lines PL, it is of importance to the high speed execution of read/write operations how to operate the column control circuit 14 quickly in response to the relief information (column address).

SUMMARY OF THE INVENTION

An object of the present invention is to reduce the access time of a semiconductor memory. More particularly, the object is to prevent a delay in access time when operating a redundancy circuit in the semiconductor memory.

Another object of the present invention is to reduce a semiconductor circuit in access time and in chip size as well.

Still another object of the present invention is to reduce the circuit scale of a redundancy circuit, thereby decreasing the chip size of the semiconductor memory.

According to one of the aspects of the present invention, a semiconductor memory includes a memory cell region, a redundancy memory cell region, a redundancy information region, and a word driver for supplying a word line selecting signal to word lines. The redundancy information region is arranged closer to the word driver with respect to the memory cell region and the redundancy memory cell region. The memory cell region has memory cells to be used in normal operations. The redundancy memory cell region has memory cells for relieving defective memory cells in the memory cell region. The redundancy information region has memory cells for retaining relief information indicating the locations of the defective memory cells. The memory cells in the memory cell region, the redundancy memory cell region, and the redundancy information region are connected to common word lines. In this semiconductor memory, a predetermined word line selecting signal (word line) is activated in accordance with the supply of an address or the like, thereby selecting predetermined memory cells in the memory cell region. Here, predetermined memory cells in the redundancy memory cell region and redundancy information region which are connected to the same word line are also selected. Word lines contain wiring resistance and load capacitance. Therefore, the closer to the word driver the memory cells are, the earlier the word line selecting signal is transmitted thereto. Since the redundancy information region is arranged closer to the word driver, the memory cells in the redundancy information region operate earlier than the memory cells in the memory cell region and the redundancy memory cell region.

When the memory cell region is in operation, the defective memory cells are deselected in accordance with the relief information held in the redundancy information region corresponding to these memory cells. The memory cells in the redundancy memory cell region which relieve the defective memory cells are selected in accordance with the relief information held in the redundancy information region corresponding to the defective memory cells. Since the memory cells in the redundancy information region that retain the relief information start operation earlier, a relief/no-relief judgment can be made earlier. As a result, the access time can be reduced in either case, relieving or not relieving memory cells.

According to another aspect of the present invention, a semiconductor memory includes a memory cell region, a redundancy memory cell region, a redundancy information region, and a plate driver for supplying a plate voltage to plate lines. The redundancy information region is arranged closer to the plate driver with respect to the memory cell region and the redundancy memory cell region. The memory cell region has memory cells to be used in normal operations. The redundancy memory cell region has memory cells for relieving defective memory cells in the memory cell region. The redundancy information region has memory cells for retaining relief information indicating the locations of the defective memory cells. The memory cells in the memory cell region, the redundancy memory cell region, and the redundancy information region are connected to common plate lines. In this semiconductor memory, a predetermined plate line is activated in accordance with the supply of an address or the like, thereby selecting predetermined memory cells in the memory cell region. Here, predetermined memory cells in the redundancy memory cell region and redundancy information region which are connected to the same plate line are also selected. Plate lines contain wiring resistance and load capacitance. Therefore, the closer to the plate driver the memory cells are, the earlier the plate voltages supplied to the plate lines are transmitted thereto. Since the redundancy information region is arranged closer to the plate driver, the memory cells in the redundancy information region operate earlier than the memory cells in the memory cell region and the redundancy memory cell region.

Consequently, as mentioned above, the memory cells in the redundancy information region which retain relief information start operation earlier, thereby allowing an earlier relief/no-relief judgment. This can reduce the access time in either case, relieving or not relieving memory cells.

According to another aspect of the present invention, a semiconductor memory includes a memory cell region, a redundancy memory cell region, and a redundancy information region. The semiconductor memory also has at least either a word driver for supplying a word line selecting signal to word lines or a plate driver for supplying a plate voltage to plate lines.

Each of these components is configured as in the semiconductor memories described above. Therefore, as mentioned above, the access time can be reduced in either case, relieving or not relieving memory cells.

According to another aspect of the present invention, the memory cell region and the redundancy memory cell region have a column switch and a redundancy column switch for inputting and outputting data to read from and/or write to the memory cells in these regions, respectively. When the relief information read from a memory cell in the redundancy information region shows "no relief," the column switch is activated to read data from and/or write data to memory cells in the memory cell region. When the relief information shows "relief," the redundancy column switch is activated to read data from and/or write data to memory cells in the redundancy memory cell region. Since the operations of the column switch and redundancy column switch are started earlier, the access time is reduced.

According to another aspect of the present invention, the memory cells in the redundancy information region consist of nonvolatile memory cells. Therefore, the relief information indicating the locations of the defective memory cells can be retained even without power supply. The nonvolatile memory cells have, for example, ferroelectric capacitors for retaining written data.

The memory cell region and the redundancy memory cell region are composed of the nonvolatile memory cells having the same configuration as those composing the redundancy information region. This makes it possible for these memory cells to be designed according to the same layout rule and fabricated by the same semiconductor processes. As a result, the chip size can be reduced. The reduced chip size combines with the facilitated fabrication processes to achieve reduction in fabrication costs.

According to another aspect of the present invention, a semiconductor memory includes a plurality of memory regions each composed of a memory cell region, a redundancy memory cell region, and a redundancy information region, and a plurality of plate drivers individually arranged next to the memory regions. In general, word lines are connected to ferroelectric capacitors through the gates of transfer transistors in memory cells. Plate lines are connected directly to the ferroelectric capacitors. Since the loads connected to the plate lines include the ferroelectric capacitances and the like of the memory cells, they are greater than the loads connected to the word lines. Forming a plurality of plate drivers corresponding to the plurality of memory regions can reduce the lengths of the plate lines, thereby decreasing the loads of the plate lines. As a result, the effect of the loads of the plate lines on access time can be minimized with reduction in access time.

According to another aspect of the present invention, a semiconductor memory includes a plurality of memory regions, as well as a plurality of redundancy memory regions, a plurality of redundancy address regions, and a plurality of redundancy flag regions respectively corresponding to the memory regions. The memory regions contain a plurality of memory cells each. The redundancy memory regions have redundancy memory cells for relieving a defect in any of the memory cells in the memory regions. That is, each single redundancy memory cell is formed per plurality of memory cells. The redundancy address regions hold, as address information, second addresses designating the defective memory cells. The redundancy flag regions hold relief information indicating the use of the redundancy memory regions.

In this semiconductor memory, a first address and a second address are supplied to the semiconductor memory. Any of the plurality of memory regions is selected in accordance with the first address. Then, any of the plurality of memory cells arranged in each memory region is selected in accordance with the second address. The memory region, the redundancy memory region, the redundancy address region, and the redundancy flag region corresponding to the same first address are activated at the same time.

When the memory region is in operation, the defective memory cell is deselected in accordance with the address information held in the redundancy address region corresponding to this memory cell. Specifically, the region containing the defective memory cell is identified by decoding a signal that is read as the address information. The redundancy memory cell to relieve the defective memory cell is selected in accordance with the relief information held in the redundancy flag region corresponding to the defective memory cell. That is, redundancy memory cells are directly selected in accordance with relief information, without using address information. Since the number of gates of circuits to be involved from the selection of a word line to the selection of a redundancy memory cell can be reduced, it is possible to reduce the time that elapses before the redundancy memory cell is selected after the selection of the word line. This makes it possible to avoid a delay in access time when relieving memory cells.

According to another aspect of the present invention, the redundancy address regions and the redundancy flag regions are composed of nonvolatile memory cells. Therefore, the address information and relief information can be retained even without power supply. The memory cells have, for example, ferroelectric capacitors for retaining written data.

According to another aspect of the present invention, the memory cells in the redundancy flag regions are each connected to one of complementary bit lines (true bit line and bar bit line) for transmitting the relief information.

For example, in writing a logical value of 1 to the memory cells, high level is transmitted to the true bit line and low level is transmitted to the bar bit line. Relief information of high level is written to the memory cells that are connected to the true bit line (true memory cells). Relief information of low level is written to the memory cells that are connected to the bar bit line (bar memory cells). Likewise, in writing a logical value of 0 to the memory cells, relief information of low level is written to the true memory cells and relief information of high level is written to the bar memory cells.

Hereinafter, description will be given of the case where the memory cells are written with a logical value of 1. To read the relief information (high level) retained in the true memory cells to the true bit line, a reference voltage is supplied to the bar bit line. A potential difference between the true bit line (high level) and the bar bit line is amplified by a sense amplifier and the like, so that the true bit line is brought to high level and the bar bit line is brought to low level. Similarly, to read the relief information (low level) retained in the bar memory cells to the bar bit line, the reference voltage is supplied to the true bit line. A potential difference between the true bit line and the bar bit line (low level) is amplified by sense amplifiers and the like, so that the true bit line is brought to high level and the bar bit line is to low level. That is, the same levels are read out to the complementary bit lines, regardless of whether the information is read out from true memory cells or bar memory cells. The relief information held in the true memory cells and the bar memory cells can be read out by using either the true bit line, or the bar bit line alone. As a result, the redundancy circuit can be formed with a simple configuration, which allows reduction in the chip size of the semiconductor memory.

According to another aspect of the present invention, the memory cells and the redundancy memory cells consist of the nonvolatile memory cells having the same configuration as those composing the redundancy memory regions and the redundancy flag regions. On this account, the memory cells in the memory regions, the redundancy memory regions, the redundancy address regions, and the redundancy flag regions can be designed on the same layout rule and fabricated by the same semiconductor processes. This allows reduction in chip size. The reduced chip size combines with the facilitated fabrication processes to achieve reduction in fabrication costs.

According to another aspect of the present invention, the nonvolatile memory cells in the memory regions, the redundancy memory regions, the redundancy address regions, and the redundancy flag regions are selected by common word lines to be activated in accordance with the first address. The use of the common word lines makes it possible to reduce the total number of word lines to be laid over the entire regions. That is, the individual regions can be minimized in layout size, with reduction in chip size.

According to another aspect of the present invention, the redundancy address regions hold binary data of the second address as the address information. Therefore, the redundancy address regions can be configured to be smaller in size.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 1:
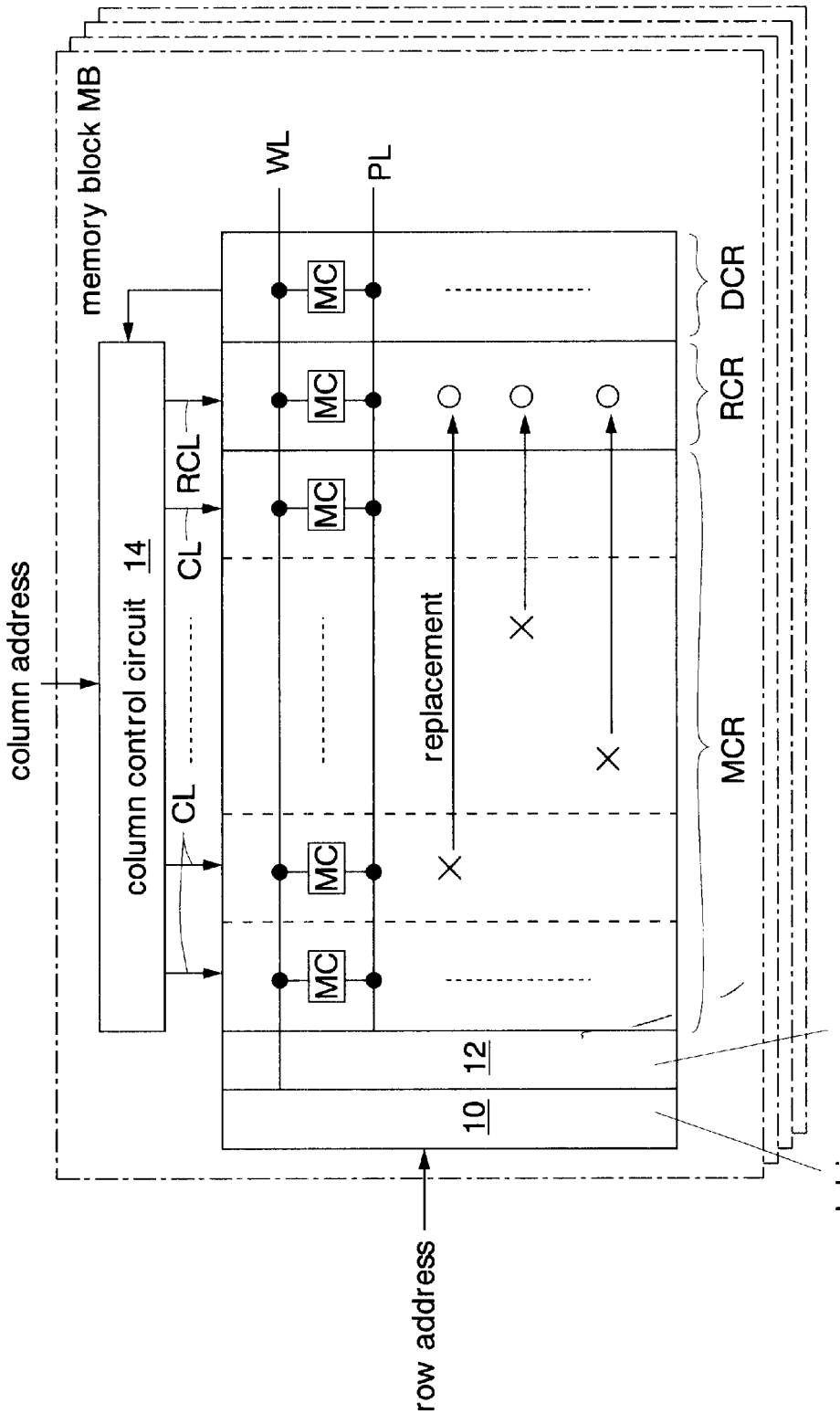
FIG. 1 is a block diagram showing an overview of a semiconductor memory having a conventional redundancy circuit.
Figure 2:
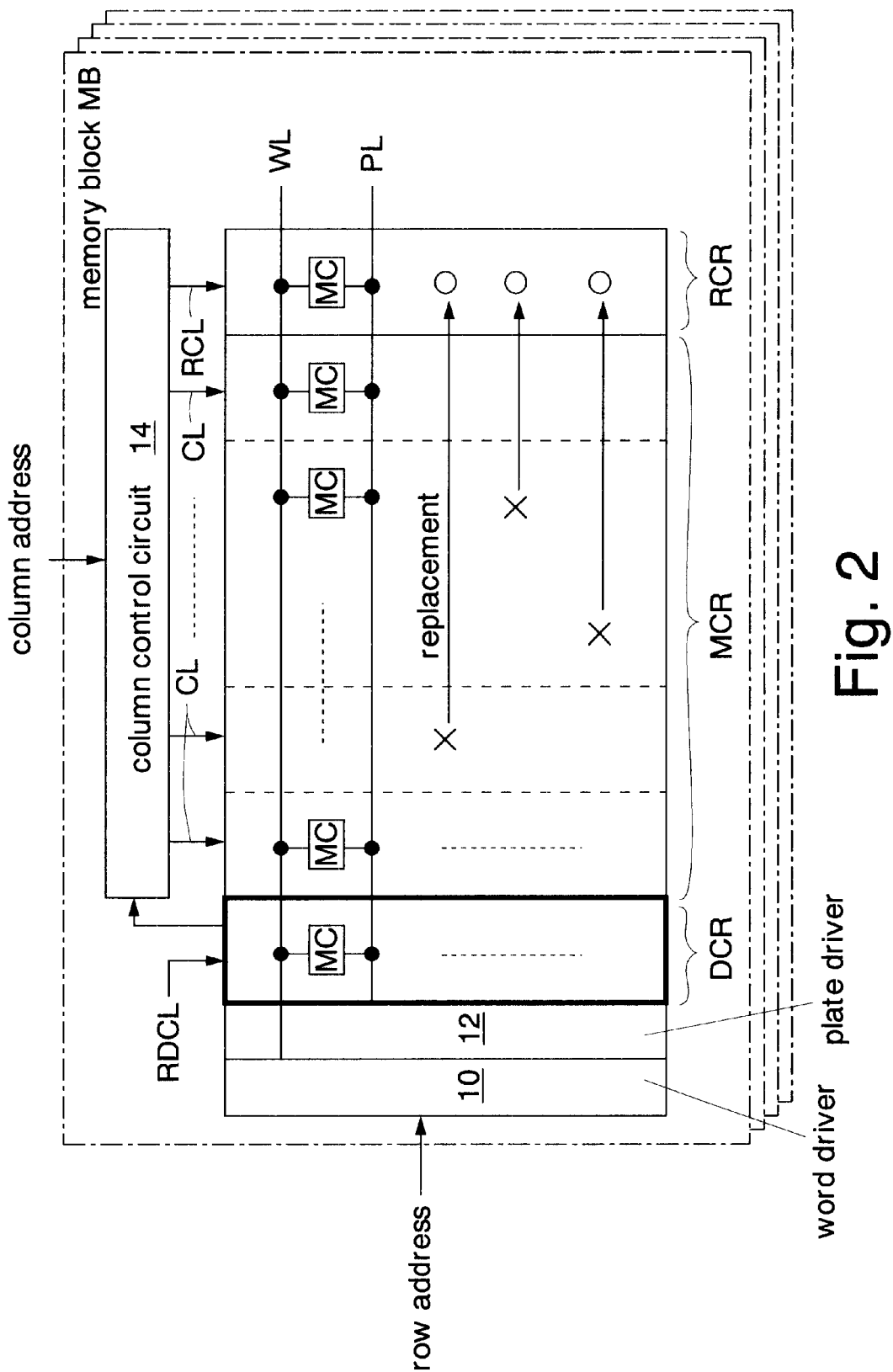
FIG. 2 is a block diagram showing a first embodiment of the semiconductor memory in the present invention.

FIG. 2 shows a first embodiment of the semiconductor memory in the present invention. The same circuits and signals as those described in the conventional art will be designated by identical reference numbers. Detailed description thereof will be omitted. This semiconductor memory is formed as a ferroelectric memory (FeRAM; Ferroelectric RAM) on a silicon substrate by using CMOS processes.

The ferroelectric memory has a plurality of memory blocks MB. The memory blocks MB each have a word driver 10, a plate driver 12, a column control circuit 14, a redundancy information region DCR (shown with thick lines in the diagram), a memory cell region MCR, and a redundancy memory cell region RCR. This ferroelectric memory is characterized by that the redundancy information region DCR is arranged closer to the word driver 10 and the plate driver 12 with respect to the memory cell region MCR and the redundancy memory cell RCR.

That is, the word driver 10 supplies a voltage to a predetermined word line WL according to a row address. The plate driver 12 supplies a voltage to a predetermined plate line PL according to the row address. The column control circuit 14 outputs column selecting signals CL and a redundancy column select signal RL to the memory cell region MCR and the redundancy memory cell region RCR, respectively, in accordance with a column address and relief information (relief address information and the like) output from the redundancy information region DCR. The memory cells MC in the memory cell region MCR, the redundancy memory cell region RCR, and the redundancy information region DCR are composed of ferroelectric capacitors and transfer transistors, and are connected to common word lines WL and plate lines PL Since the memory cells MC in the redundancy information region DCR are made of ferroelectric capacitors, relief information is retained even without power supply. Memory cells MC that are activated between a word line WL and a plate line PL become accessible. Relief information is written to the redundancy information region DCR by turning on the column switches CLS (to be described later) in the redundancy information region DCR in response to the activation of a redundancy write signal RDCL.

Figure 3:
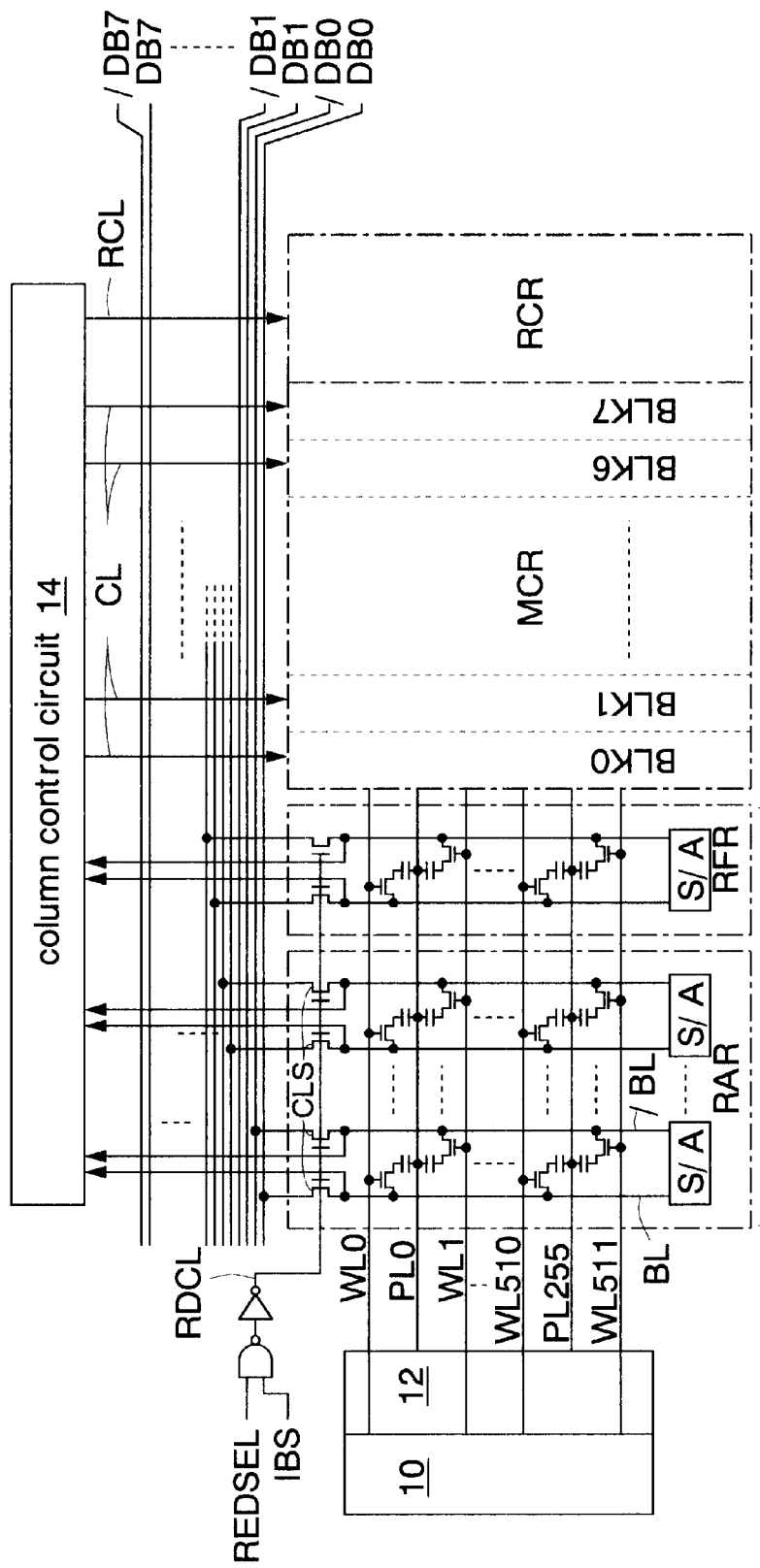
FIG. 3 is a circuit diagram showing the details of the redundancy information region of FIG. 2.

FIG. 3 shows the details of the redundancy information region DCR.

The redundancy information region DCR is composed of a redundancy address region RAR and a redundancy flag region RFR. The redundancy address region RAR and the redundancy flag region. RFR have a plurality of memory cells MC for retaining relief information, a column switch or column switches CLS, and a sense amplifier or sense amplifiers S/A. In this connection, the memory cell region MCR and the redundancy memory cell region RCR have the same basic layout as that of the redundancy information region DCR. That is, the layout data on the basic blocks of these regions DCR, MCR, and RCR are identical excepting the wiring from the exterior of the region (for example, aluminum wiring on upper layers). In the regions DCR, MCR, and RCR, the memory cells MC and their peripheral circuits are designed upon the same layout rule and fabricated by using the same semiconductor process technologies. This consequently allows reduction in chip size. The reduced chip size combines with the facilitated fabrication processes to achieve reduction in fabrication costs.

The gates of the selecting transistors in the memory cells MC are connected to one of word lines WL0–WL511 each. The ferroelectric capacitors in the memory cells MC are connected at one ends to the selecting transistors and at the other ends to one of plate lines PL0–PL255 each. The memory cells MC are connected to one of complementary bit lines BL and /BL each. In other words, the memory cells MC connected to the even-numbered word lines WL0, WL2, . . . are connected to true bit lines BL The memory cells MC connected to the odd-numbered word lines WL1, WL3, . . . are connected to bar bit lines /BL. The bit lines BL are connected to one of data lines DB0–DB7 each. The bit lines /BL are connected to one of data lines /DB0–/DB7 each.

The redundancy address region RAR contains 1536 memory cells MC for retaining 512 pieces of 3-bit address information (lower three bits of the column address) word line by word line. The column switches CLS in the redundancy address region RAR turn on when the redundancy write signal RDCL is activated. The redundancy write signal RDCL is activated when a redundancy write signal REDSEL and a block selecting signal IBS are activated. Three memory cells MC connected to each word line retain, as address information, a defect address (binary data) which designates one of blocks BLK0–BLK7 (to be described later) in the memory cell region MCR. The address information is written through the data lines DB0–DB2 and /DB0–/DB2 when the redundancy write signal RDCL is at high level.

The redundancy flag region RFR has 512 memory cells MC for retaining 512 pieces of 1-bit relief information. The column switch CLS in the redundancy flag region RFR turns on when the redundancy write signal RDCL is activated. The relief information is written through the data lines DB3 and /DB3 when the redundancy write signal REDSEL and the block selecting signal IBS are at high level.

The data held in the redundancy address region RAR and the redundancy flag region RFR is directly output to the column control circuit 14 through the bit lines BL and /BL. The redundancy address region RAR is enabled when logic 1 is written in the redundancy flag region RFR, and is disabled when logic 0 is written in the redundancy flag region RFR.

The memory cell region MCR is composed of eight blocks BLK0–BLK7. Each of the blocks has 4096 memory cells MC for retaining 512 pieces of 8-bit input/output data. That is, each single block has a memory capacity of 4 Kbit. The blocks BLK0–BLK7 are identified by the lower three bits of the column address.

The redundancy memory cell region RCR contains 4096 memory cells MC corresponding to a single block of memory cell region MCR. The redundancy memory cell region RCR has 16 column switches CLS (not shown) which are controlled by a single redundancy column selecting signal RCL.

Figure 4:
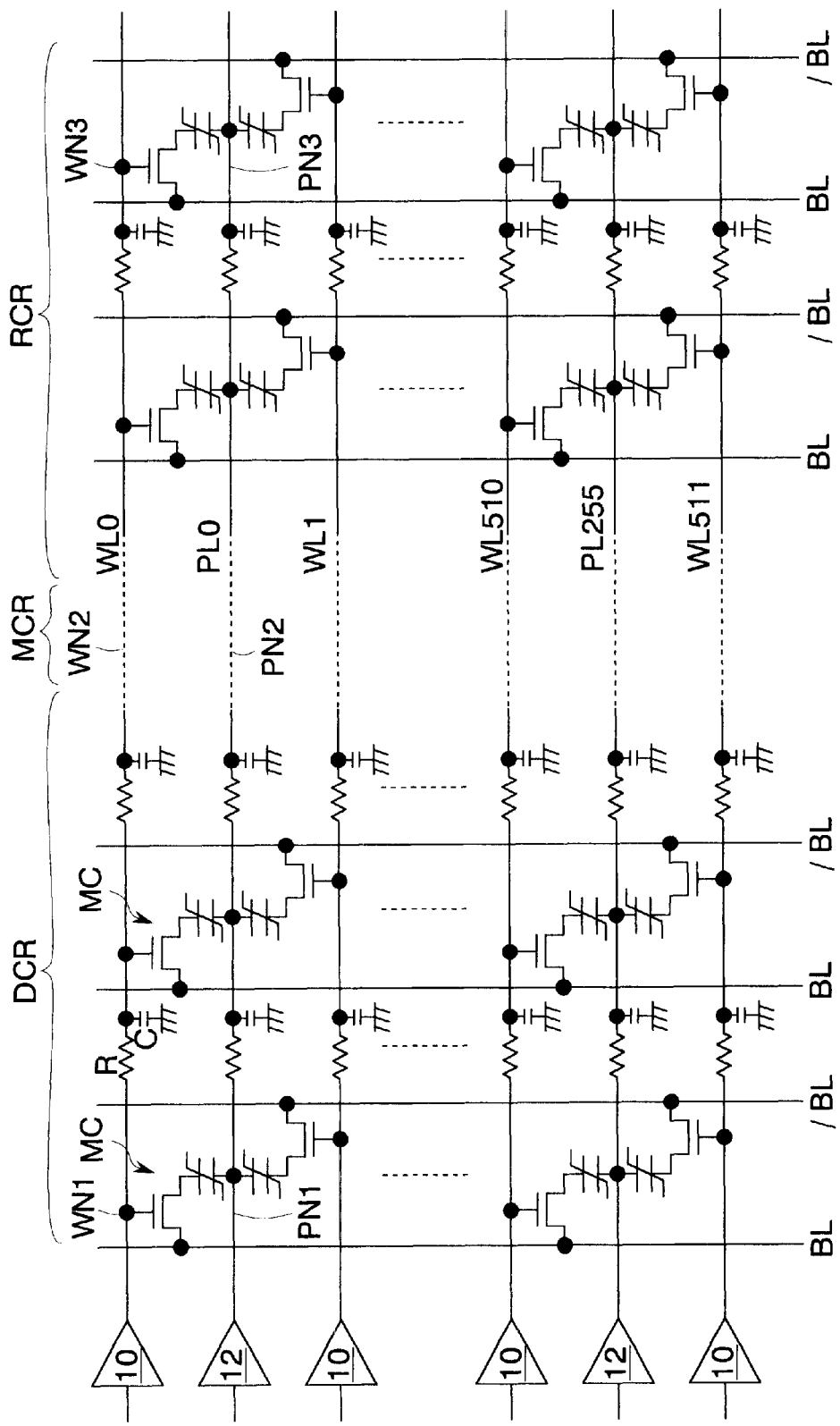
FIG. 4 is an equivalent circuit diagram of the essential parts of FIG. 2.

FIG. 4 shows an equivalent circuit of the memory cell region MCR, redundancy memory cell region RCR, and redundancy information region DCR along the direction of the word lines WL.

The word lines WL and the plate lines PL are laid common to the redundancy information region DCR, the memory cell region MCR, and the redundancy memory cell region RCR as shown in FIG. 2, with greater wiring lengths. For this reason, the word lines WL and the plate lines PL have parasitic resistances R and parasitic capacitances C. Word line selecting signals supplied from the word driver 10 to the word lines WL are transmitted earlier to memory cells MC that are closer to the word driver 10. That is, the word line selecting signals are transmitted in the order of nodes WN1, WN2, and WN3. Similarly, plate voltages supplied from the plate driver 12 to the plate lines PL are transmitted earlier to memory cells MC that are closer to the plate driver 12. That is, the plate voltages are transmitted in the order of nodes PN1, PN2, and PN3.

The redundancy information region DCR is arranged next to the word driver 10 and the plate driver 12. Thus, when predetermined word and plate lines WL and PL are activated, memory cells MC in the redundancy information region DCR operate earlier than memory cells MC in the memory cell region MCR and the redundancy memory cell region RCR do.

Figure 5:
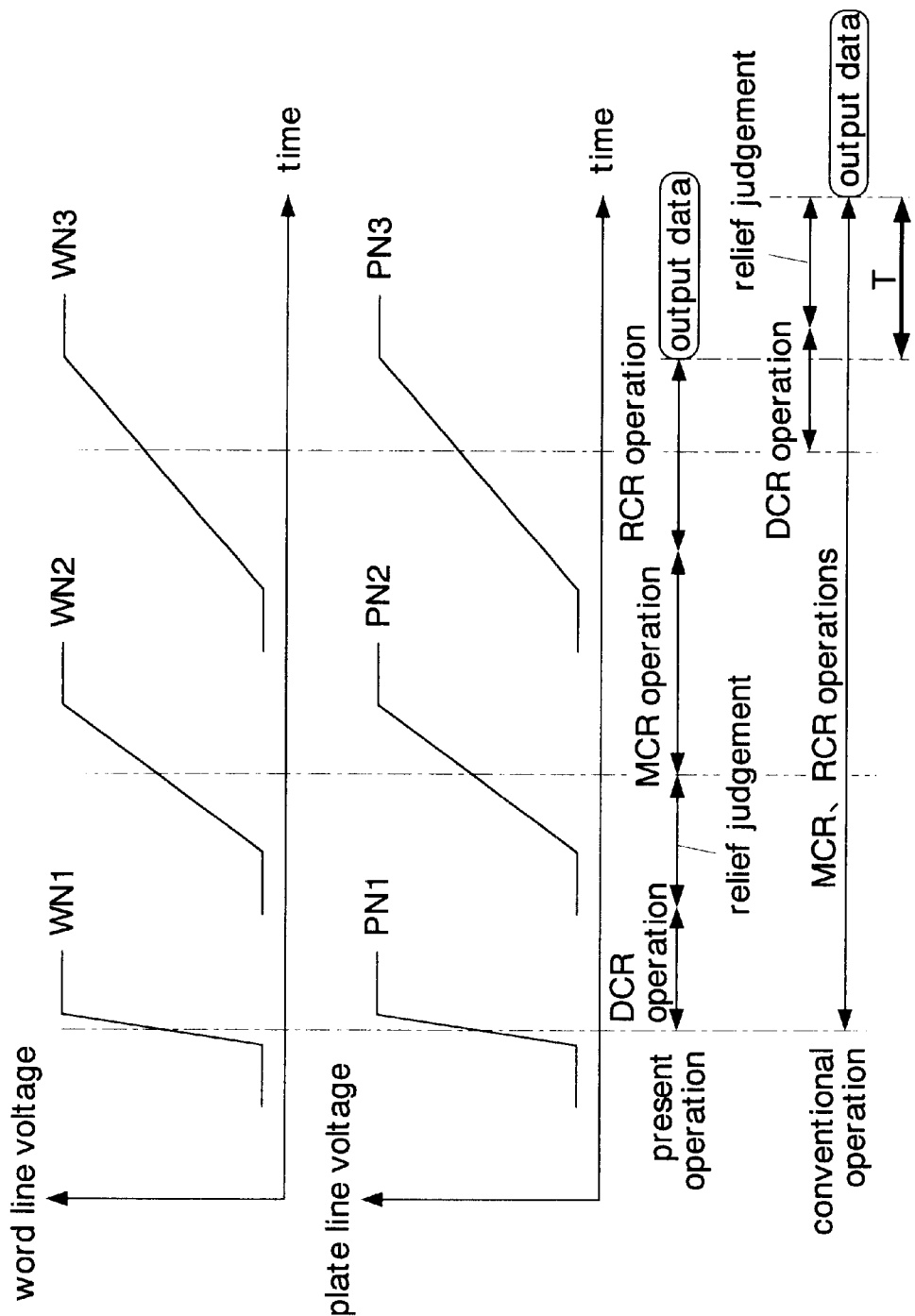
FIG. 5 is an explanatory diagram showing voltage variations on a word line WL and a plate line PL in a read operation according to the first embodiment, and the operations of the redundancy information region, the memory cell region, and the redundancy memory cell region.

FIG. 5 shows voltage variations on a word line WL and a plate line PL in a read operation, and the operations of the redundancy information region DCR, the memory cell region MCR, and the redundancy memory cell region RCR.

The nodes WN1, WN2, and WN3 of the word line WL and the nodes PN1, PN2, and PN3 of the plate line PL change to high level (activate) in the order of proximity to the word driver 10 and the plate driver 12. Nodes farther from the word driver 10 and the plate driver 12 have greater CR time constants, and thus have gentler rising waveforms.

In the ferroelectric memory of the present invention, the redundancy information region DCR operates in response to the changes to high levels of the nodes WN1 and PN1, outputting relief information. In accordance with the relief information, the column control circuit 14 judges for "relief" or "no relief" (relief judgment). Next, the memory cell region MCR and the redundancy memory cell region RCR operate in response to the changes to high levels of the nodes WN2, PN2 and the nodes WN3, PN3. Data read from the memory cells MC to the bit lines BL (or /BL) is amplified by the sense amplifiers S/A. In accordance with the result of the relief judgment and the column address, the column control circuit 14 activates the column selecting signal CL or the redundancy column selecting signal RCL. Then, read data is output. Note that FIG. 5 shows the time axis with exaggeration. In reality, the relief judgment and the MCR operation are performed overlappingly, and the MCR operation and the RCR operation are performed almost at the same time. (Comparative example) In a conventional ferroelectric memory, the memory cell region MCR and the redundancy memory cell region RCR operate first, in response to the changes to high levels of the nodes WN1 and PN1. Thereafter, the redundancy information region DCR operates in response to the changes to high levels of the nodes WN3 and PN3. This results in a late relief judgment, delaying the output of read data. According to the present invention, a relief judgment can be made earlier. Therefore, in relieving or not relieving the memory cells, the access time can be reduced by time T as compared with heretofore.

In FIG. 5, the timing of change of the word line WL and the plate line PL is identical regardless of a read operation or a write operation. Besides, the timing of the relief judgment shows the operation timing of the column switches and the redundancy column switches. Accordingly, during write operations in which data is written to the memory cells MC through the column switches and the redundancy column switches, the access time can be reduced as in read operations.

As has been described, in the present embodiment, the redundancy information region DCR is arranged closer to the word driver 10 and the plate driver 12. Since the memory cells MC in the redundancy information region DCR, retaining the relief information, start operation earlier than the memory cells MC in the memory cell region MCR and the redundancy memory cell region RCR, whether to relieve or not can be judged earlier in read operations and write operations. More specifically, in response to the relief information, the operations of the column switches and the redundancy column switches are started earlier. This allows reduction of access time in either case, relieving or not relieving the memory cells.

The memory cells MC in the redundancy information region DCR consist of nonvolatile memory cells MC having ferroelectric capacitors. Therefore, the relief information can be retained even without power supply.

The memory cell region MCR and the redundancy memory cell region RCR are composed of the nonvolatile memory cells having the same configuration as those composing the redundancy information region DCR. Therefore, the memory cells in the redundancy information region DCR, memory cell region MCR, and redundancy memory cell region RCR, and the peripheral circuits thereof can be designed on the same layout rule and fabricated by using the same semiconductor process technologies. This allows reduction in chip size. The reduced chip size combines with the facilitated fabrication processes to achieve reduction in fabrication costs.

Figure 6:
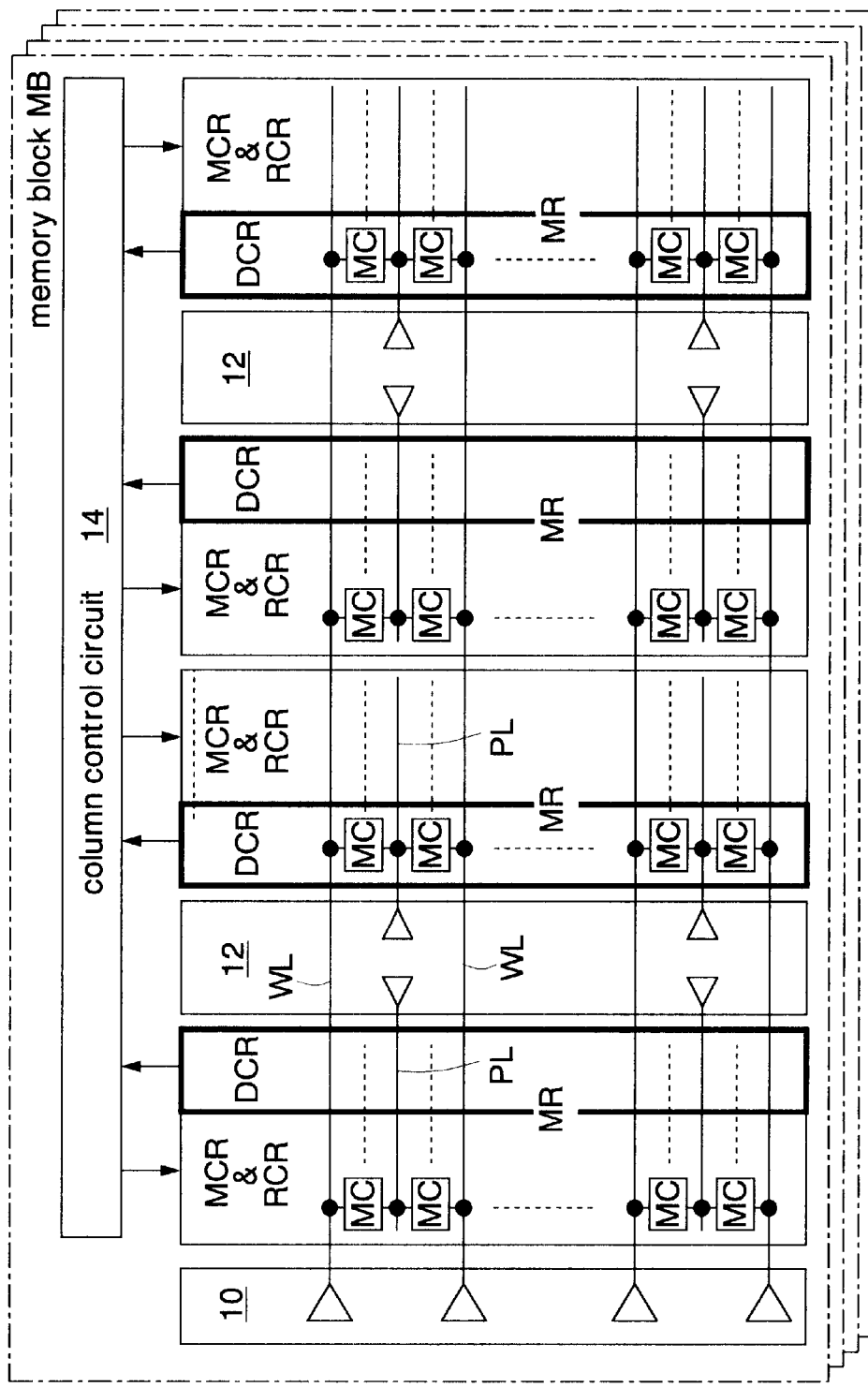
FIG. 6 is a block diagram showing a second embodiment of the semiconductor memory in the present invention.

FIG. 6 shows a second embodiment of the semiconductor memory in the present invention. The same circuits and signals as those described in the conventional art and in the first embodiment will be designated by identical reference numbers. Detailed description thereof will be omitted.

In this embodiment, each memory block MB has a word driver 10, two plate drivers 12, and four memory regions MR. Each memory region MR is composed of a memory cell region MCR, a redundancy memory cell region RCR, and a redundancy information region DCR. The word driver 10 is arranged on the left end of the memory block MB in the diagram. Each plate driver 12 is arranged between two memory regions MR. The redundancy information regions DCR (shown with thick frames in the diagram) are arranged closer to the plate drivers 12 with respect to the respective memory cell regions MCR and redundancy memory cell regions RCR. Word lines WL are laid common to the four memory regions. Plate lines PL are wired to the memory regions MR independently. The other configurations and signal connections are the same as heretofore.

In general, word lines WL are connected to ferroelectric capacitors through the gates of transfer transistors in memory cells MC. Plate lines PL are connected directly to the ferroelectric capacitors. Therefore, the loads connected to the plate lines PL contain the ferroelectric capacitances and the like of the memory cells MC, growing greater than the loads connected to the word lines WL.

In this embodiment, given a plurality of memory regions MR, a plurality of plate drivers 12 are formed so that the redundancy information regions DCR are arranged near the plate drivers 12 which drive the high-load plate lines PL This allows reduction in access time which compares favorably with that of the first embodiment.

This embodiment can offer the same effects as those obtained from the first embodiment described above. Besides, in this embodiment, even when a plurality of memory regions MR are provided, a plurality of plate drivers 12 corresponding to these memory regions MR can be formed to minimize the effects of the loads of the plate lines PL on the access time. That is, the access time can be reduced.

Figure 7:
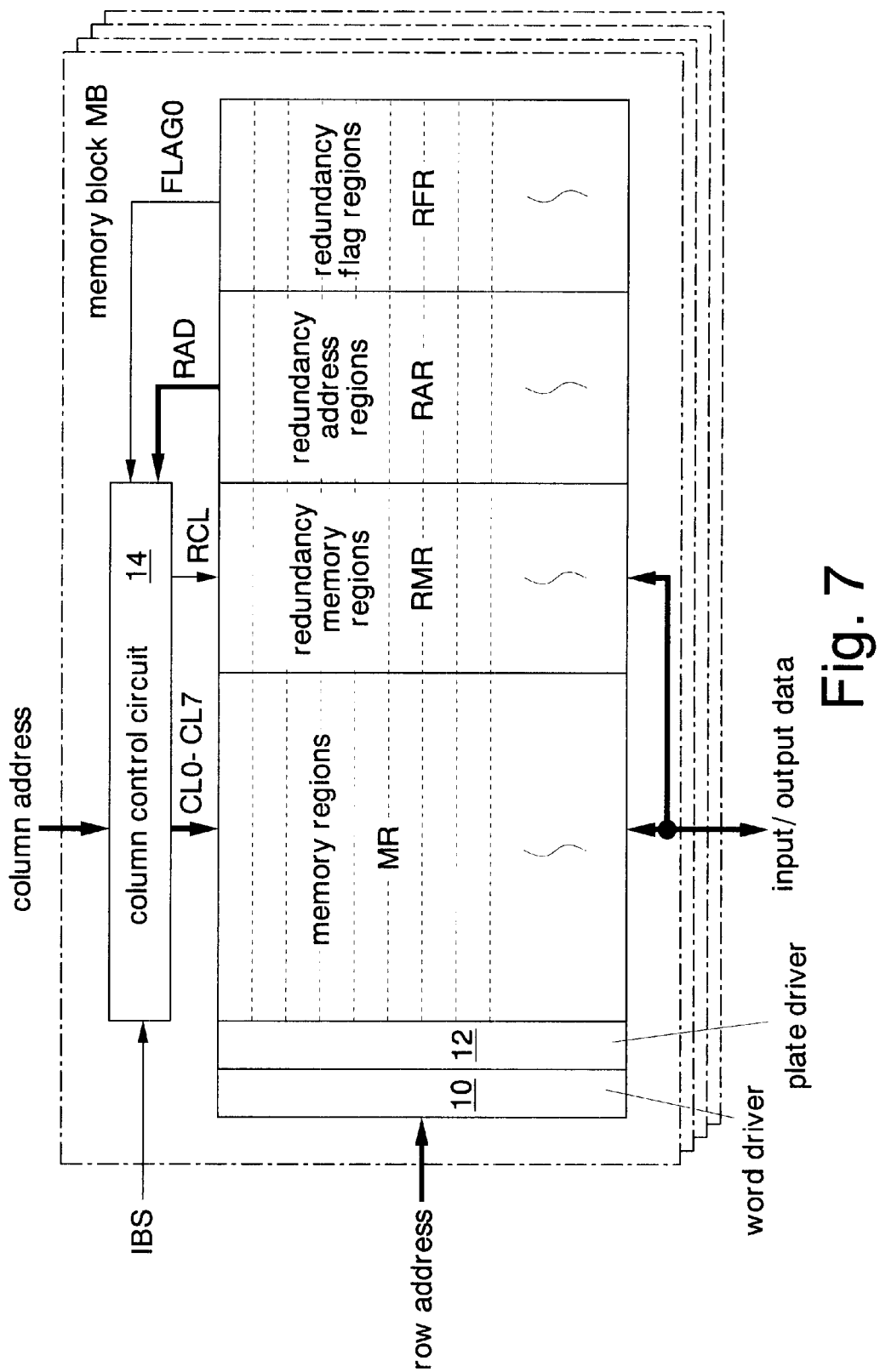
FIG. 7 is a block diagram showing an embodiment of the semiconductor memory in the present invention.

FIG. 7 shows a third embodiment of the semiconductor memory in the present invention. This semiconductor memory is formed as a ferroelectric memory on a silicon substrate by using CMOS processes. In the diagram, thick lines represent signal lines that consist of a plurality of lines each.

The ferroelectric memory has a plurality of memory blocks MB and a control circuit (not shown) for controlling these memory blocks MB. The memory blocks MB each have a word driver 10, a plate driver 12, a column control circuit 14, a plurality of memory regions MR, a plurality of redundancy memory regions RMR, a plurality of redundancy address regions RAR, and a plurality of redundancy flag regions RFR.

The word driver 10 supplies a voltage to a predetermined word line (to be described later) according to a row address (corresponding to the first address). The plate driver 12 supplies a voltage to a predetermined plate line (to be described later) according to the row address. The column control circuit 14 outputs column selecting signals CL0–CL7 and a redundancy column selecting signal RCL to the memory regions MR and the redundancy memory regions RMR, respectively, in accordance with a block selecting signal IBS, a column address (corresponding to the second address), address information RAD from the redundancy address regions RAR, and a flag signal FLAG0 from the redundancy flag regions RFR. The data read/written from/to the memory regions MR and the redundancy memory regions RMR is input and output as input/output data.

Figure 8:
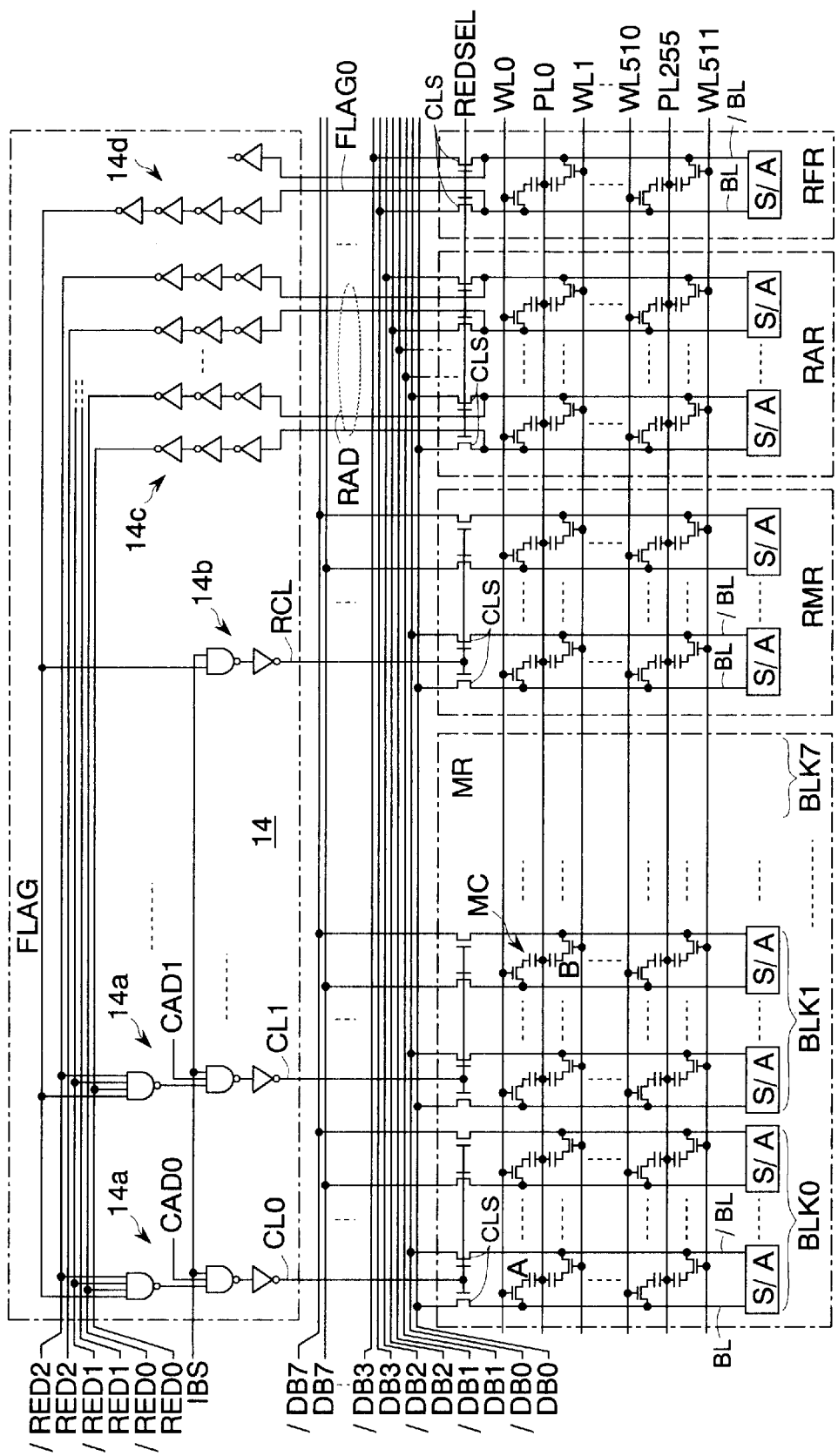
FIG. 8 is a circuit diagram showing the details of a memory block in FIG. 7.

FIG. 8 shows the details of a memory block MB.

The memory regions MR, the redundancy memory regions RMR, the redundancy address regions RAR, and the redundancy flag regions RFR have a plurality of memory cells MC. The memory regions MR, the redundancy memory regions RMR, the redundancy address regions RAR, and the redundancy flag regions RFR constitute respective memory cell regions which have column selecting switches CLS and sense amplifiers S/A, and are identical in basic layout. That is, the layout data on the basic blocks of these regions MR, RMR, RAR, and RFR are identical excepting the wiring from the exterior of the region (for example, aluminum wiring on upper layers). Incidentally, in the diagram, the memory cell regions corresponding to the regions MR, RMR, RAR, and RFR are designated by reference symbols MR, RMR, RAR, and RFR, respectively.

In any of the regions MR, RMR, RAR, and RFR, the gates of the selecting transistors in the memory cells MC are connected to one of word lines WL0–WL511 each. That is, a predetermined word line is selected in accordance with the supply of the row address, so that the memory region MR, redundancy memory region RMR, redundancy address region RAR, and redundancy flag region RFR connected to this word line are activated at the same time. The ferroelectric capacitors in the memory cells MC are connected at one ends to the selecting transistors and at the other ends to one of plate lines PL0–PL255 each. The memory cells MC are connected to either of complementary bit lines BL and /BL each. In other words, the memory cells MC connected to the even-numbered word lines WL0, WL2, . . . are connected to true bit lines BL. The memory cells MC connected to the odd-numbered word lines WL1, WL3, . . . are connected to bar bit lines /BL. Hereinafter, the true bit lines BL and the bar bit lines /BL will be referred to simply as bit lines BL and /BL. The bit lines BL each are connected to one of data lines DB0–DB7. The bit lines /BL each are connected to one of data lines /DB0–/DB7.

The memory cell region composed of the memory regions MR contains eight blocks BLK0–BLK7. Each of the blocks has 4096 memory cells MC for retaining 512 pieces of 8-bit input/output data. That is, each single block has a memory capacity of 4 Kbit. The blocks BLK0–BLK7 are identified by the lower three bits of the column address. Specifically, 16 column selecting switches CLS on each single block are controlled by an identical column selecting signal CL0 (or CL1–CL7).

The memory cell region composed of the redundancy memory regions RMR contains 4096 memory cells MC which correspond to a single block of memory region MR. The sixteen column selecting switches CLS of the redundancy memory region RMR are controlled by the same column selecting signal RCL0. The redundancy memory regions RMR, as will be described later, can relieve any of the eight blocks word line by word line.

The memory cell region composed of the redundancy address regions RAR has 1536 memory cells MC for retaining 512 pieces of 3-bit address information (lower three bits of the column address) word line by word line. The column switches CLS in the redundancy address regions RAR are controlled by a redundancy write signal REDSEL. Three memory cells MC connected to each word line retain, as address information, a defect address (binary data) which designates one of the blocks BLK0–BLK7. The address information is written through the data lines DB0–DB2 and /DB0–/DB2 when the redundancy write signal REDSEL is at high level.

The memory cell region composed of the redundancy flag regions RFR has 512 memory cells MC for retaining 512 pieces of 1-bit relief information. The column switches CLS in the redundancy flag regions RFR are controlled by the redundancy write signal REDSEL. The relief information is written through the data lines DB3 and /DB3 when the redundancy write signal REDSEL is at high level.

The redundancy address regions RAR are enabled when logic 1 (relief information) is written in the redundancy flag regions RFR, and are disabled when logic 0 is written in the redundancy flag regions RFR.

The column control circuit 14 has eight column decoders 14a for selecting the column selecting switches CIS in the memory regions MR, a decoder 14b for selecting the column selecting switches CLS in the redundancy memory regions RMR, a buffer 14c for outputting the address information (RAD) held in the redundancy address regions RAR to redundancy bus lines RED0–RED2 and /RED0–/RED2, and a buffer 14d for outputting the relief information (FLAG0) held in the redundancy flag regions RFR as a flag signal FLAG.

Next, the operations of the ferroelectric memory will be described for situations where the memory regions MR have defects in memory cells MC that are designated by symbols A and B.

In FIG. 8, address information "000" and "001" is written to the memory cells MC that are connected to the same word lines WL0 and WL1 the defective memory cells MC designated by the symbols A and B are connected to, respectively. Relief information "1" is written to the memory cells MC of the redundancy flag regions RFR. To write the address information and the relief information, the ferroelectric memory in its testing process is initially brought into a test mode. Next, a redundancy write command and the like are input. This changes the redundancy write signal REDSEL to high level, so that the column selecting switches for the redundancy address regions RAR and the redundancy flag regions RFR are turned on. Then, the address information and the relief information are written to the memory cells MC.

Figure 9:
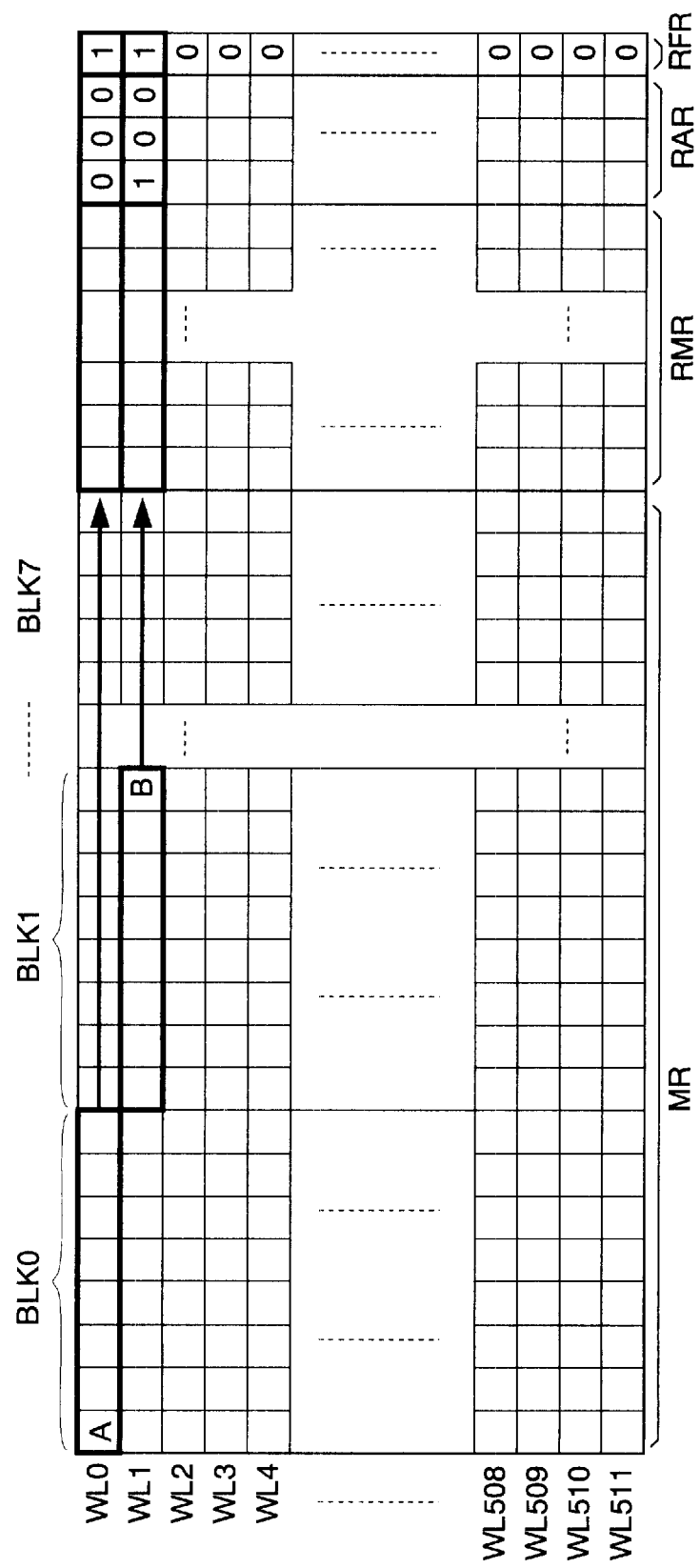
FIG. 9 is an explanatory diagram showing an overview of the memory block after the write of address information and relief information.

FIG. 9 shows an overview of the memory block after the write of the address information and the relief information.

When a defect lies in the memory cell MC at the location A on the block BLK0 of the memory region MR, "000" which indicates the column address of the block BLK0 is written to the redundancy address region RAR corresponding to the same word line WL0. Relief information "1" is written to the redundancy flag region RFR corresponding to the same word line WL0.

When another defect lies in the memory cell MC at the location B on the block BLK1 of the memory region MR, address information "001" which indicates the column address of the block BLK1 is written to the redundancy address region RAR corresponding to the same word line WL1. Relief information "1" is written to the redundancy flag region RFR corresponding to the same word line WL1. Here, in the redundancy address regions RAR, the memory cells MC shown to the left in the diagram correspond to the least significant bit. Therefore, the address information to be written actually is "100" as shown in the diagram.

Relief information "0" is written to the memory cells of the redundancy flag regions RFR that are connected to the word lines WL2–WL511 corresponding to defectless memory cells. Any or no address information may be written to the memory cells of the redundancy address regions RAR that are connected to the word lines WL2–WL511 coresponding to the defectless memory cells.

Data of electrically inverted logic is written to memory cells MC that are connected to bar bit lines /BL. That is, when data of logic 1 is written to memory cells MC that are connected to bit lines BL and /BL, respectively, the pieces of data retained in these memory cells MC show electrically inverted properties.

If in a read operation the word line WL0 is activated to access the region including the memory cell MC at the location A, the memory cells MC of the redundancy memory region RMR, the redundancy address region RAR, and the redundancy flag region RFR connected to the word line WL0 shown in FIG. 9 are also accessed. Here, a decoding signal CAD0 of the column address and the block selecting signal IBS turn to high level.

When the word line WL0 is activated, the pieces of data retained in the memory cells MC of the memory region MR, the redundancy memory region RMR, the redundancy address region RAR, and the redundancy flag region RFR are read out to the true bit lines BL and amplified by the sense amplifiers S/A. More specifically, before the data is read out to the bit lines BL, the bit lines BL and /BL are supplied with a reference voltage (precharge). Then, the potential differences between the voltages of the bit lines BL changed by the read operation and the bit lines /BL are amplified by the sense amplifiers S/A.

In accordance with the data (address information) read from the redundancy address region RAR, the redundancy bus lines RED0–RED2 turn to high level and the redundancy bus lines /RED0–/RED2 turn to low level. In accordance with the data (relief information) read from the redundancy flag region RFR, the flag signal FLAG turns to high level. In the column control circuit 14, the decoder 14a corresponding to the block BLK0 is inactivated by the redundancy bus lines /RED0–/RED2 of low level, thereby changing the column select signal CL0 to low level. The column selecting switches CLS in the block BLK0 turn off in response to the column selecting signal CL0 of low level. That is, the block BLK0 containing the defective memory cell MC is deselected in accordance with the address information.

Meanwhile, the decoder 14b in the column control circuit 14 is activated by the flag signal FLAG and block selecting signal IBS of high level, thereby turning the redundancy column selecting signal RCL to high level. The column selecting switches CLS for the redundancy memory regions RMR turn on in response to the redundancy column selecting signal RCL of high level. That is, the redundancy memory region RMR is selected in accordance with the relief information. Then, the memory cells MC of the block BLK0, shown in a thick frame in FIG. 9 are replaced with the memory cells of the redundancy memory region RMR, whereby the defective memory cell is relieved.

Similarly, in a read operation, the word line WL1 is activated to access the region including the memory cell MC at the location B. Here, the pieces of data retained in the memory cells MC of the memory region MR, the redundancy memory region RMR, the redundancy address region RAR, and the redundancy flag region RFR are read out to the bar bit lines BL and amplified by the sense amplifiers S/A.

In accordance with the data (address information) read from the redundancy address region RAR, the redundancy bus lines /RED0, RED1, and RED2 turn to high level and the redundancy bus lines RED0, /RED1, and /RED2 turn to low level. In the column control circuit 14, the decoder 14a corresponding to the block BLK1 is inactivated by the redundancy bus lines RED0, /RED1, and /RED2 of low level, so that the block BLK1 including the defective memory cell MC is inactivated in accordance with the address information.

Meanwhile, the decoder 14b in the column control circuit 14 is activated by the flag signal FLAG and block selecting signal IBS of high level, thereby turning the redundancy column selecting signal RCL to high level. The column selecting switches CLS for the redundancy memory regions RMR turn on in response to the redundancy column selecting signal RCL of high level. That is, the redundancy memory region RMR is selected in accordance with the relief information. Then, the memory cells MC of the block BLK1, shown in a thick frame in FIG. 9 are replaced with the memory cells of the redundancy memory region RMR, whereby the defective memory cell is relieved.

In this way, the redundancy memory cells MC in the redundancy memory regions RMR are directly selected in accordance with the relief information, without the use of the address information. This allows reduction in the number of gates of circuits to be involved from the selection of the word line WL0 to the selecting of the redundancy memory cells MC. Therefore, it is possible to avoid a delay in access time when relieving memory cells MC.

The same operations as described above are also made in write operations. The only difference between a read operation and a write operation lies in whether the data is transmitted from the memory cells MC to the data lines DB0–DB7 and /DB0–/DB7 through the column selecting switches CLS or the data is transmitted from the data lines DB0–DB7 and /DB0–/DB7 to the memory cells MC through the column selecting switches CLS.

Figure 10:
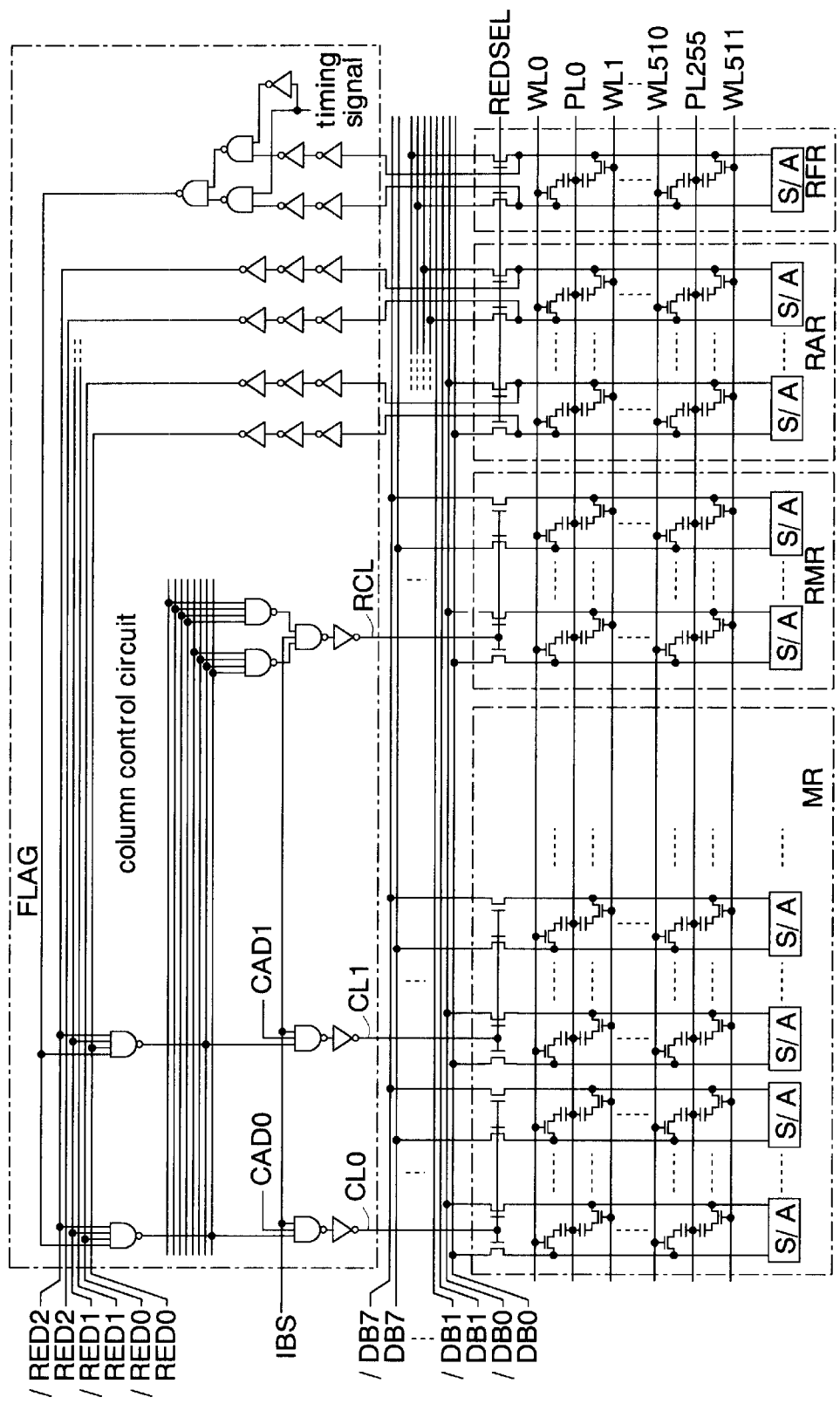
FIG. 10 is a circuit diagram showing the details of a memory block that has been studied before the achievement of the present invention.

FIG. 10 shows the details of a memory block which the present inventors have studied before the achievement of the present invention.

This memory block MB has a column control circuit that differs from the column control circuit 14 of the present invention. More specifically, in the memory block MB shown in FIG. 10, the decoders for selecting the column selecting switches CLS in the redundancy memory regions RMR cover the logic of the address information (data on the redundancy bus lines RED0–RED2 and /RED0–/RED2). This increases the number of gates of circuits to be involved from the selection of the word line WL0 to the selecting of the redundancy memory cells MC. As a result, when a word line is selected, it takes longer before redundancy memory cells MC are selected. This means slower access time in relieving memory cells MC. Additionally, since the complementary bit lines BL and /BL are used to output relief information from the redundancy flag regions RFR, the logic circuit for generating the flag signal FLAG increases in scale as compared with FIG. 8.

As has been described, in the semiconductor memory of the present invention, the redundancy memory cells MC in the redundancy memory regions RMR are directly selected on the basis of the relief information without using the address information. This allows reduction in the number of gates of circuits to be involved from the selection of the word line WL0 to the selecting of the redundancy memory cells MC. Therefore, it is possible to reduce the time that elapses before the redundancy memory cells MC are selected after the selection of the word line WL0. This makes it possible to avoid a delay in access time when relieving memory cells MC.

The memory cells MC consist of nonvolatile memory cells having ferroelectric capacitors. Therefore, the relief information can be retained even without power supply.

The memory cells MC in the redundancy flag regions RFR are alternately connected to the complementary bit lines BL and /BL. Of these, only the relief information to be transmitted to the true bit line BL is used to generate the flag signal FLAG. Therefore, the column control circuit 14 (redundancy circuit) can be formed in a simple configuration, with reduction in the chip size of the ferroelectric memory.

The memory regions MR, the redundancy memory regions RMR, the redundancy address regions RAR, and the redundancy flag regions RFR all are composed of the memory cells MC having the same configurations. Therefore, these regions can be designed on the same layout rule and fabricated by the same semiconductor processes. This allows reduction in chip size. Memory cells are to a semiconductor memory the largest number of elements to be arranged within the chip. Reducing the areas occupied by the memory cells thus produces a great effect of reducing the chip sizes. The reduced chip size combines with the facilitated fabrication processes to achieve reduction in fabrication costs.

The memory cells MC in the memory regions MR, the redundancy memory regions RMR, the redundancy address regions RAR, and the redundancy flag regions RFR are connected to the common word lines WL0–WL511. This allows reduction in the total number of word lines to be laid in these regions. That is, the individual regions can be minimized in layout size, with reduction in chip size.

For address information, the redundancy address regions RAR hold binary data of the column address. Therefore, the redundancy address regions can be configured smaller in size.

Note that the first and second embodiments described above have dealt with the cases where the semiconductor memory is composed of memory cells MC having a ferroelectric capacitor. However, the present invention is not limited to such embodiments. For example, the semiconductor memory may be composed of nonvolatile memory cells having a floating gate and a control gate.

The first and second embodiments described above have dealt with the cases where the memory cell region MCR, the redundancy memory cell region RCR, and the redundancy information region DCR are composed of memory cells MC having a ferroelectric capacitor. However, the present invention is not limited to such embodiments. For example, the memory cell region MCR and the redundancy memory cell region RCR may be composed of volatile memory cells while the redundancy information region DCR is composed of nonvolatile memory cells.

The third embodiment described above has dealt with the case where the semiconductor memory is composed of memory cells MC having a ferroelectric capacitor. However, the present invention is not limited to such an embodiment. For example, the semiconductor memory may be composed of nonvolatile memory cells having a floating gate and a control gate.

The third embodiment described above has dealt with the case where the memory regions MR, the redundancy memory regions RMR, the redundancy address regions RAR, and the redundancy flag regions RFR are composed of memory cells MC having a ferroelectric capacitor. However, the present invention is not limited to such an embodiment. For example, the memory regions MR and the redundancy memory regions RMR may be composed of volatile memory cells while the redundancy address regions RAR and the redundancy flag regions RFR consist of nonvolatile memory cells.

The invention is not limited to the above embodiments and various modifications may be made without departing from the spirit and scope of the invention. Any improvement may be made in part or all of the components.

What is claimed is:

1. A semiconductor memory comprising:
   a memory cell region having memory cells to be used in normal operations;
   a redundancy memory cell region having a memory cell for relieving a defective memory cell in said memory cell region;
   a redundancy information region having memory cells for retaining relief information indicating a location of said defective memory cell;
   a common word line connected to said memory cells in said memory cell region, said redundancy memory cell region, and said redundancy information region; and
   a word driver for supplying a word line selecting signal to said common word line, wherein
   said redundancy information region is arranged closer to said word driver than to said memory cell region and said redundancy memory cell region.

2. The semiconductor memory according to claim 1, wherein:
   said memory cell region and said redundancy memory cell region have a column switch and a redundancy column switch for inputting and outputting data to read from and write to said memory cells, respectively; and
   one of said column switch and said redundancy column switch is activated in accordance with said relief information read from said memory cell in said redundancy information region.

3. The semiconductor memory according to claim 1, wherein
   said memory cell in said redundancy information region is composed of a nonvolatile memory cell.

4. The semiconductor memory according to claim 3, wherein
   said nonvolatile memory cell has a ferroelectric capacitor for retaining written data.

5. The semiconductor memory according to claim 3, wherein
   said memory cell region and said redundancy memory cell region are composed of nonvolatile memory cells having the same configuration as that composing said redundancy information region.

6. The semiconductor memory according to claim 5, wherein
   said nonvolatile memory cell has a ferroelectric capacitor for retaining written data.

7. A semiconductor memory comprising:
   a memory cell region having memory cells to be used in normal operations;
   a redundancy memory cell region having a memory cell for relieving a defective memory cell in said memory cell region;
   a redundancy information region having memory cells for retaining relief information indicating a location of said defective memory cell;
   a common plate line connected to said memory cells in said memory cell region, said redundancy memory cell region, and said redundancy information region; and
   a plate driver for supplying a plate voltage to said common plate line, wherein
   said redundancy information region is arranged closer to said plate driver than to said memory cell region and said redundancy memory cell region.

8. The semiconductor memory according to claim 7, wherein:
   said memory cell region and said redundancy memory cell region have a column switch and a redundancy column switch for inputting and outputting data to read from and write to said memory cells, respectively; and
   one of said column switch and said redundancy column switch is activated in accordance with said relief information read from said memory cell in said redundancy information region.

9. The semiconductor memory according to claim 7, wherein
   said memory cell in said redundancy information region is composed of a nonvolatile memory cell.

10. The semiconductor memory according to claim 9, wherein
    said nonvolatile memory cell has a ferroelectric capacitor for retaining written data.

11. The semiconductor memory according to claim 9, wherein
    said memory cell region and said redundancy memory cell region are composed of nonvolatile memory cells having the same configuration as that composing said redundancy information region.

12. The semiconductor memory according to claim 11, wherein
    said nonvolatile memory cell has a ferroelectric capacitor for retaining written data.

13. The semiconductor memory according to claim 7, comprising:
- a plurality of memory regions each including said memory cell region, said redundancy memory cell region, and said redundancy information region; and
- a plurality of plate driver regions respectively arranged next to said memory regions.

14. A semiconductor memory comprising:
- a memory cell region having memory cells to be used in normal operations;
- a redundancy memory cell region having a memory cell for relieving a defective memory cell in said memory cell region;
- a redundancy information region having memory cells for retaining relief information indicating a location of said defective memory cell;
- a common word line connected to said memory cells in said memory cell region, said redundancy memory cell region, and said redundancy information region;
- a common plate line connected to said memory cells in said memory cell region, said redundancy memory cell region, and said redundancy information region;
- a word driver for supplying a word line selecting signal to said common word line; and
- a plate driver for supplying a plate voltage to said common plate line, wherein
  said redundancy information region is arranged closer to at least one of said word driver and said plate driver than to said memory cell region and said redundancy memory cell region.

15. The semiconductor memory according to claim 14, wherein:
- said memory cell region and said redundancy memory cell region have a column switch and a redundancy column switch for inputting and outputting data to read from and write to said memory cells, respectively; and
- one of said column switch and said redundancy column switch is activated in accordance with said relief information read from said memory cell in said redundancy information region.

16. The semiconductor memory according to claim 14, wherein
said memory cell in said redundancy information region is composed of a nonvolatile memory cell.

17. The semiconductor memory according to claim 16, wherein
said nonvolatile memory cell has a ferroelectric capacitor for retaining written data.

18. The semiconductor memory according to claim 16, wherein
said memory cell region and said redundancy memory cell region are composed of nonvolatile memory cells having the same configuration as that composing said redundancy information region.

19. The semiconductor memory according to claim 18, wherein
said nonvolatile memory cell has a ferroelectric capacitor for retaining written data.

20. A semiconductor memory comprising:
- a plurality of memory regions to be selected in accordance with a first address;
- a plurality of memory cells arranged in each of said memory regions, and selected in accordance with a second address;
- a plurality of redundancy memory regions formed corresponding to said memory regions, and having redundancy memory cells for relieving a defect in any of said memory cells in said memory regions;
- a plurality of redundancy address regions formed corresponding to said memory regions, for holding said second address indicating a location of said memory cell with a defect as address information; and
- a plurality of redundancy flag regions formed corresponding to said memory regions, for holding relief information indicating use of said redundancy memory regions, and wherein
  said memory region, said redundancy memory region, said redundancy address region, and said redundancy flag region corresponding to a same first address are activated at the same time,
  said memory cell with a defect is deselected in accordance with said address information held in said redundancy address region corresponding to the memory cell with a defect, when said memory region is in operation, and
  said redundancy memory cell for relieving said memory cell with a defect is selected in accordance with said relief information held in said redundancy flag region corresponding to the memory cell with a defect.

21. The semiconductor memory according to claim 20, wherein
said redundancy address regions and said redundancy flag regions are composed of nonvolatile memory cells.

22. The semiconductor memory according to claim 21, wherein
said nonvolatile memory cell has a ferroelectric capacitor for retaining written data.

23. The semiconductor memory according to claim 21, wherein:
- said memory cells in said redundancy flag regions are connected to one of complementary bit lines for transmitting said relief information; and
- said relief information is read through one of the bit lines.

24. The semiconductor memory according to claim 21, wherein
said memory cells and said redundancy memory cells are composed of nonvolatile memory cells having the same configurations as those composing said redundancy address regions and said redundancy flag regions.

25. The semiconductor memory according to claim 24, wherein
said nonvolatile memory cells in said memory regions, said redundancy memory regions, said redundancy address regions, and said redundancy flag regions are connected to common word lines to be activated in accordance with said first address.

26. The semiconductor memory according to claim 20, wherein
said redundancy address regions hold binary data of said second address as said address information.

* * * * *